(12) United States Patent
Hase

(10) Patent No.: US 10,756,681 B2
(45) Date of Patent: Aug. 25, 2020

(54) POWER AMPLIFIER MODULE

(71) Applicant: Murata Manufacturing Co., Ltd., Kyoto (JP)

(72) Inventor: Masatoshi Hase, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/513,880

(22) Filed: Jul. 17, 2019

(65) Prior Publication Data

US 2019/0341889 A1    Nov. 7, 2019

Related U.S. Application Data

(63) Continuation of application No. 15/871,524, filed on Jan. 15, 2018, now Pat. No. 10,396,722.

(30) Foreign Application Priority Data

Jan. 17, 2017 (JP) ................. 2017-006036

(51) Int. Cl.
*H03F 1/32* (2006.01)
*H03F 3/213* (2006.01)
(Continued)

(52) U.S. Cl.
CPC ............. *H03F 1/32* (2013.01); *H03F 1/0205* (2013.01); *H03F 1/0211* (2013.01); *H03F 1/565* (2013.01);
(Continued)

(58) Field of Classification Search
CPC ........ H03F 1/32; H03F 1/0205; H03F 1/0211; H03F 3/213; H03F 3/195; H03F 3/211; H03F 1/565; H03F 2200/387; H03F 2200/451; H03F 2201/3215; H03F 2200/391; H03F 2200/267
(Continued)

(56) References Cited

U.S. PATENT DOCUMENTS 5,325,000 A    6/1994    Birkeland et al.
5,939,939 A    8/1999    Gaynor et al.
(Continued)

FOREIGN PATENT DOCUMENTS

JP    2010-521834 A    6/2010
JP    2012-054874 A    3/2012

*Primary Examiner* — Robert J Pascal
*Assistant Examiner* — Kimberly E Glenn
(74) *Attorney, Agent, or Firm* — Pearne & Gordon LLP

(57) ABSTRACT

A power amplifier module includes a combining circuit including a combiner. The combining circuit further includes a first inductor connected in series between an output terminal of a first amplifier and the combiner, a second inductor connected in series between an output terminal of a second amplifier and the combiner, and a second capacitor having an end connected to the combiner and another end grounded. A phase of a third signal from the output terminal of the first amplifier to the second amplifier through the combiner is delayed by about 45 degrees in the first inductor and the second capacitor, and is delayed by about 45 degrees in the second inductor and the second capacitor. A phase of the third signal from the output terminal of the first amplifier to the second amplifier through the first capacitor is advanced by about 90 degrees.

19 Claims, 14 Drawing Sheets

(51) Int. Cl.
*H03F 3/195* (2006.01)
*H03F 1/02* (2006.01)
*H03F 1/56* (2006.01)
*H03F 3/21* (2006.01)

(52) U.S. Cl.
CPC ............ *H03F 3/195* (2013.01); *H03F 3/211* (2013.01); *H03F 3/213* (2013.01); *H03F 2200/267* (2013.01); *H03F 2200/387* (2013.01); *H03F 2200/391* (2013.01); *H03F 2200/451* (2013.01); *H03F 2201/3215* (2013.01)

(58) Field of Classification Search
USPC ........................................................ 333/295
See application file for complete search history.

(56) References Cited

U.S. PATENT DOCUMENTS

| | | | |
|---|---|---|---|
| 6,104,247 A | 8/2000 | Ha | |
| 7,492,239 B1* | 2/2009 | Sarkees | ................... H03H 7/48 333/100 |
| 9,246,444 B2 | 1/2016 | Hase et al. | |
| 2008/0204134 A1 | 8/2008 | Knickerbocker et al. | |

* cited by examiner

POWER AMPLIFIER MODULE

This is a continuation of U.S. patent application Ser. No. 15/871,524 filed on Jan. 15, 2018, which claims priority from Japanese Patent Application No. 2017-006036 filed on Jan. 17, 2017. The contents of these applications are incorporated herein by reference in its entirety.

BACKGROUND

The present disclosure relates to a power amplifier module. A mobile communication device such as a cellular phone is provided with a power amplifier for amplifying a transmit signal. For example, Japanese Unexamined Patent Application Publication No. 2012-54874 discloses a radio-frequency amplifier including, to meet requirements for high output power, a power divider circuit that divides an input signal into signals, a set of amplifier elements that amplify the respective signals that are divided, and a power combining circuit that combines the amplified signals. The radio-frequency amplifier includes an isolation resistor that electrically connects output terminals of the set of amplifier elements to each other, and a passive element connected in parallel to the isolation resistor to increase impedance. Thus, if a signal from one path enters the other path in an unbalanced mode, the isolation resistor absorbs power, which ensures isolation between the amplifier elements.

There is a demand for improved performance of power amplifiers in accordance with a change in the communication standard to be applied. In communication standards such as Long Term Evolution-Advanced (LTE-Advanced), carrier aggregation that enables simultaneous transmission of a plurality of transmit signals of different frequency bands is used. Power amplifiers with improved output power and improved output linearity are demanded accordingly.

Typically, the performance of an amplifier element is maximized when the impedance on the load side as seen from the amplifier element is approximately a real number. In this regard, in the configuration disclosed in Japanese Unexamined Patent Application Publication No. 2012-54874, a single passive element performs impedance matching between the amplifier elements and the load side of the radio-frequency amplifier, which results in a substantially maximum imaginary part of the impedance of the amplifier elements on the load side. Accordingly, depending on the configuration disclosed in Japanese Unexamined Patent Application Publication No. 2012-54874, there is a limitation on improvements of the performance of the amplifier elements, and it is difficult to improve linearity.

BRIEF SUMMARY

Accordingly, the present disclosure provides a power amplifier module that achieves high output power and high linearity.

According to embodiments of the present disclosure, a power amplifier module includes a divider circuit that divides an input signal into a first signal and a second signal, a first amplifier that amplifies the first signal and outputs a third signal, a second amplifier that amplifies the second signal and outputs a fourth signal, a combining circuit including a combiner that combines the third signal and the fourth signal and that outputs an amplified signal of the input signal, a resistance element that electrically connects an output terminal of the first amplifier and an output terminal of the second amplifier to each other, and a first capacitor connected in parallel to the resistance element. The combining circuit includes a first inductor connected in series between the output terminal of the first amplifier and the combiner, a second inductor connected in series between the output terminal of the second amplifier and the combiner, and a second capacitor having an end connected to the combiner and another end grounded. A phase of the third signal from the output terminal of the first amplifier to the output terminal of the second amplifier through the combiner is delayed by about 45 degrees in a first phase shifter including the first inductor and the second capacitor, and is delayed by about 45 degrees in a second phase shifter including the second inductor and the second capacitor. A phase of the third signal from the output terminal of the first amplifier to the output terminal of the second amplifier through the first capacitor is advanced by about 90 degrees.

According to embodiments of the present disclosure, it may be possible to provide a power amplifier module that achieves high output power and high linearity.

Other features, elements, and characteristics of the present disclosure will become more apparent from the following detailed description of embodiments of the present disclosure with reference to the attached drawings.

DETAILED DESCRIPTION

Embodiments of the present disclosure will be described in detail hereinafter with reference to the drawings. The same or substantially the same elements are identified with the same numerals and are not described repeatedly.

Figure 1:
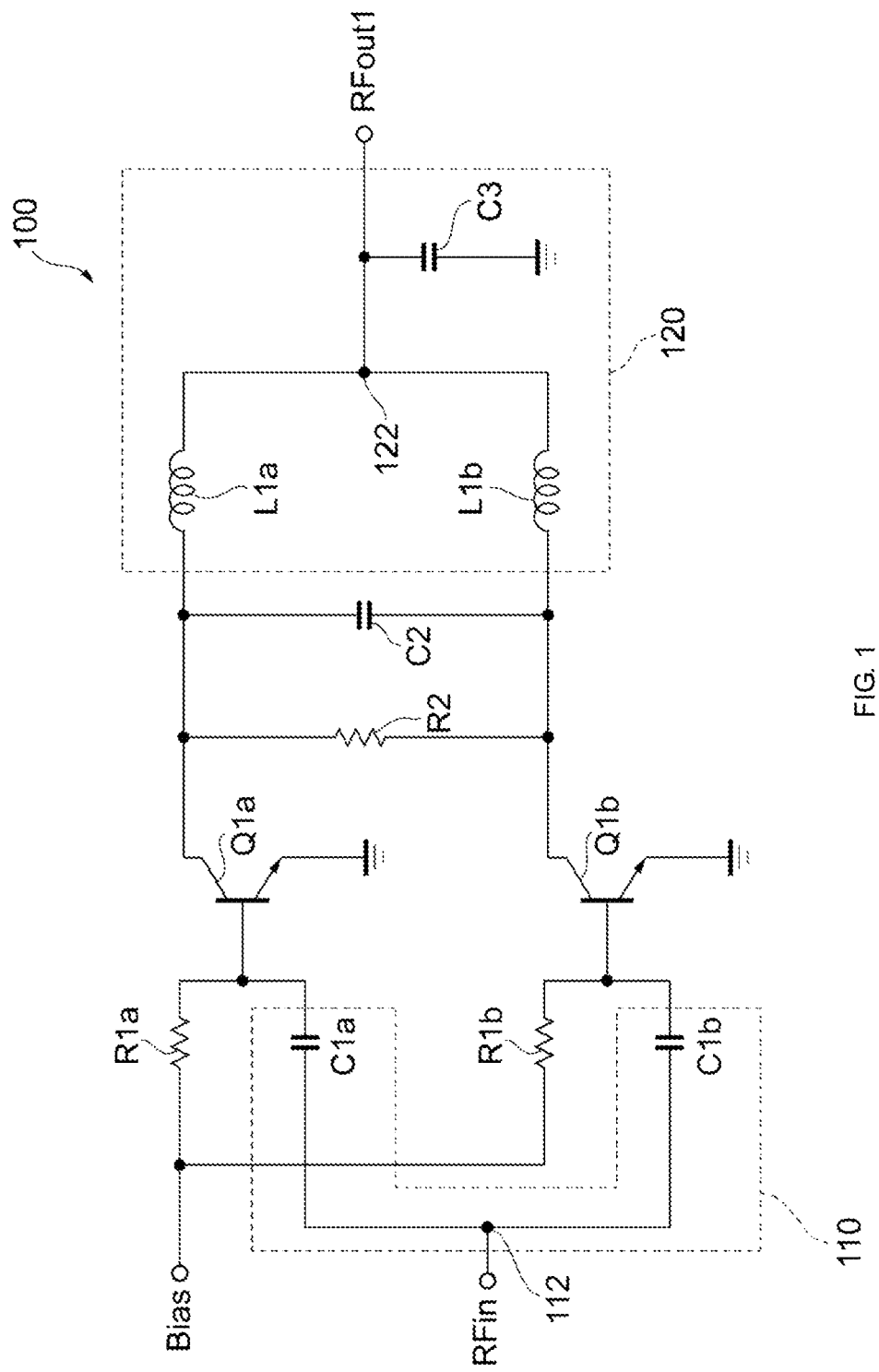
FIG. 1 is a diagram illustrating an example configuration of a power amplifier module according to a first embodiment of the present disclosure.

FIG. 1 is a diagram illustrating an example configuration of a power amplifier module according to a first embodiment of the present disclosure. A power amplifier module 100 illustrated in FIG. 1 is incorporated in a cellular phone, for example, and is used to amplify the power of signals to be transmitted to a base station. The power amplifier module 100 amplifies the power of signals based on communication standards such as second generation mobile communication systems (2G), third generation mobile communication systems (3G), fourth generation mobile communication systems (4G), fifth generation mobile communication systems (5G), Long Term Evolution-Frequency Division Duplex (LTE-FDD), Long Term Evolution-Time Division Duplex (LTE-TDD), LTE-Advanced, and LTE-Advanced Pro. The communication standards of signals to be amplified by the power amplifier module 100 are not limited to those described above.

The power amplifier module 100 includes a divider circuit 110, transistors Q1a and Q1b, a combining circuit 120, resistance elements R1a, R1b, and R2, and a capacitor C2. The divider circuit 110, the transistors Q1a and Q1b, and the combining circuit 120 form a closed-loop circuit. The constituent elements will be described in detail hereinbelow.

In the divider circuit 110, a distributor 112 approximately equally divides a radio-frequency (RF) signal RFin (input signal) input from an input terminal into a signal (first signal) on the transistor Q1a side and a signal (second signal) on the transistor Q1b side. The RF signal RFin has a frequency of about several gigahertz (GHz), for example. The divider circuit 110 includes capacitors C1a and C1b. The capacitors C1a and C1b have first ends connected to the distributor 112 and second ends connected to bases of the transistors Q1a and Q1b, respectively. The capacitors C1a and C1b remove the direct-current component of the RF signal RFin. The configuration of the divider circuit 110 is not limited to that described above. For example, the divider circuit 110 may be constituted by a 3-dB coupler or a lumped circuit.

Each of the transistor Q1a (first amplifier) and the transistor Q1b (second amplifier) is an amplifier that amplifies a signal output from the divider circuit 110. While the amplifier is not limited to any specific type, a heterojunction bipolar transistor (HBT) is used as each of the amplifiers, by way of example, in FIG. 1. Specifically, the transistor Q1a has a base connected to the second end of the capacitor C1a, an emitter grounded, and a collector (output terminal) from which an amplified signal (third signal) obtained by amplifying the RF signal is output. Likewise, the transistor Q1b has a base connected to the second end of the capacitor C1b, an emitter grounded, and a collector (output terminal) from which an amplified signal (fourth signal) obtained by amplifying the RF signal is output. A bias voltage or bias current Bias is supplied to the base of the transistor Q1a via the resistance element R1a, and the bias voltage or bias current Bias is supplied to the base of the transistor Q1b via the resistance element R1b. Each amplifier may be any other transistor such as a field-effect transistor (metal-oxide-semiconductor field effect transistor (MOSFET)). When a MOSFET is used instead of a bipolar transistor, a collector, a base, and an emitter may be read as a drain, a gate, and a source, respectively.

The combining circuit 120 includes an inductor L1a (first inductor), an inductor L1b (second inductor), a capacitor C3 (second capacitor), and a combiner 122. The combiner 122 combines the amplified signal (third signal) output from the collector of the transistor Q1a and the amplified signal (fourth signal) output from the collector of the transistor Q1b and outputs an amplified signal RFout1. The inductor L1a is connected in series between the collector of the transistor Q1a and the combiner 122, and the inductor L1b is connected in series between the collector of the transistor Q1b and the combiner 122. The capacitor C3 has an end connected to the combiner 122 and another end grounded. The capacitor C3 has a capacitance that is about twice the capacitance of the capacitor C2, for example. The functions of the inductors L1a and L1b and the capacitor C3 will be described below.

The resistance element R2 electrically connects the collector of the transistor Q1a and the collector of the transistor Q1b to each other.

The capacitor C2 (first capacitor) is connected in parallel to the resistance element R2. Specifically, the capacitor C2 has an end connected to the collector of the transistor Q1a and another end connected to the collector of the transistor Q1b.

Next, the operations of the power amplifier module 100 in an unbalanced mode and a balanced mode will be described with reference to FIGS. 2 to 8. The balanced mode is a mode in which both the power level and phase of the amplified signal output from the transistor Q1a have substantially the same values as the power level and phase of the amplified signal output from the transistor Q1b, and the unbalanced mode is a mode in which at least one of the power level and phase of the amplified signal output from the transistor Q1a has a different value from the at least one of the power level and phase of the amplified signal output from the transistor Q1b. The unbalanced mode occurs due to variations in the production of transistors or transmission lines, for example.

Figure 2:
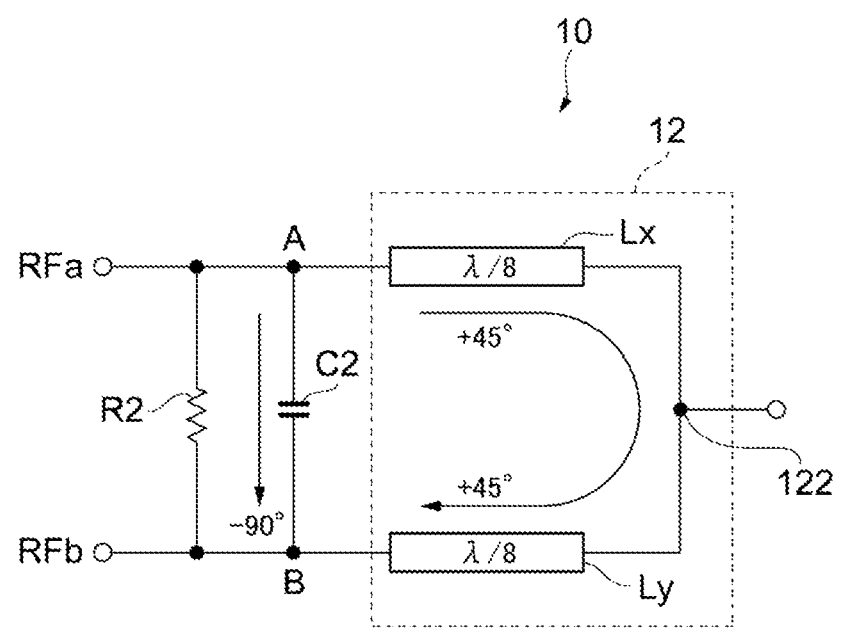
FIG. 2 is an equivalent circuit diagram of a combining circuit in a comparative example in an unbalanced mode.

FIG. 2 is an equivalent circuit diagram of a combining circuit in a comparative example in the unbalanced mode. In this specification, in a comparative example (comparative example 10), a configuration (a combining circuit 12) is used that does not include the capacitor C3 included in the combining circuit 120 illustrated in FIG. 1 but includes transmission lines Lx and Ly instead of the inductors L1a and L1b, respectively. The transmission lines Lx and Ly are X/8 lines, where X denotes the wave length of the RF signal, and the RF signal has phase shifts of 45 degrees across the transmission lines Lx and Ly. For convenience of illustration, the constituent elements included in the comparative example 10 are identified with numerals similar to those of the corresponding constituent elements of the power amplifier module 100.

Consideration is given to the case where, in the comparative example 10, an amplified signal output from one transistor enters the path on the other transistor side. Here, by way of example, a description will be given of the case in which an amplified signal RFa output from the transistor Q1a enters the path on the transistor Q1b side, whereas no description will be given of the case in which an amplified signal RFb output from the transistor Q1b enters the path on the transistor Q1a side. The phase of the amplified signal RFa that passes through a node A illustrated in FIG. 2 is delayed by about 45 degrees by passing through the transmission line Lx, and is further delayed by about 45 degrees by passing through the transmission line Ly after passing through the combiner 122 (see FIG. 2). Accordingly, the phase of the signal from the node A to a node B through the transmission line Lx, the combiner 122, and the transmission line Ly is delayed by about 90 degrees with respect to the phase of the amplified signal RFa at the node A. In contrast, the phase of the signal from the node A to the node B through the capacitor C2 is advanced by about 90 degrees with respect to the phase of the amplified signal RFa at the node A. Therefore, in the unbalanced mode, the phase of the signal at the node B is approximately opposite to the phase of the signal at the node A. That is, even if an amplified signal in one amplification path enters the other amplification path, the signal has amplitudes that cancel each other out, and isolation is ensured between the amplifiers.

Figure 3:
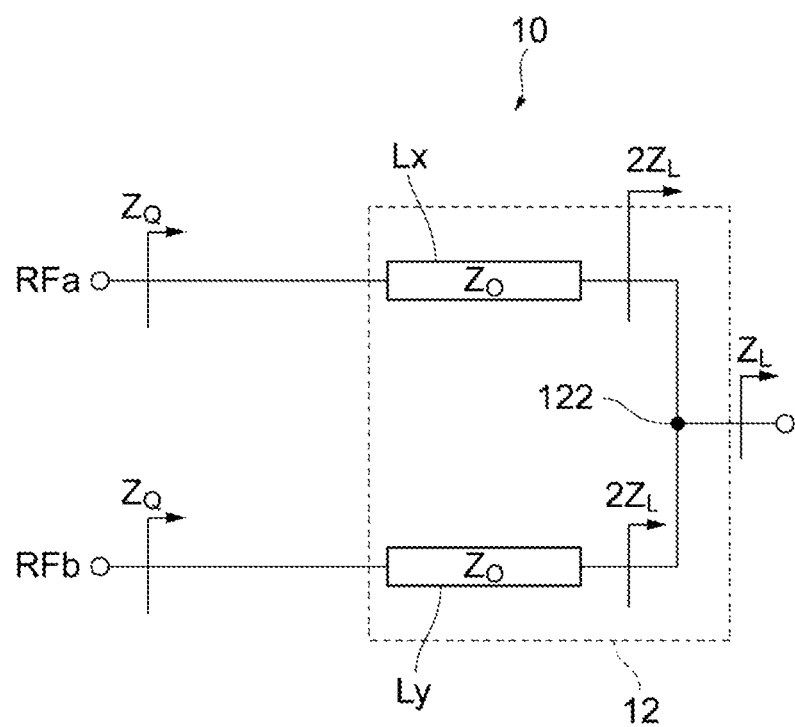
FIG. 3 is an equivalent circuit diagram of the combining circuit in the comparative example in a balanced mode.

FIG. 3 is an equivalent circuit diagram of the combining circuit in the comparative example in the balanced mode. In the balanced mode, an input signal is divided into signals having the same amplitude and the same phase by a divider circuit, and thus signals at both ends of the resistance element R2 and the capacitor C2 have the same amplitude and the same phase. In the equivalent circuit illustrated in FIG. 3, the resistance element R2 and the capacitor C2 are not illustrated.

As illustrated in FIG. 3, the impedance on the combining circuit side as seen from the output of the transistors is represented by $Z_Q$, the characteristic impedance of the transmission lines Lx and Ly is represented by $Z_0$, and the impedance on the load side as seen from the combiner 122 is represented by $Z_L$. Since the transmission line Lx and the transmission line Ly are connected in parallel, the impedances on the load side as seen from the output of the transmission lines Lx and Ly are each equal to $2Z_L$.

Figure 4:
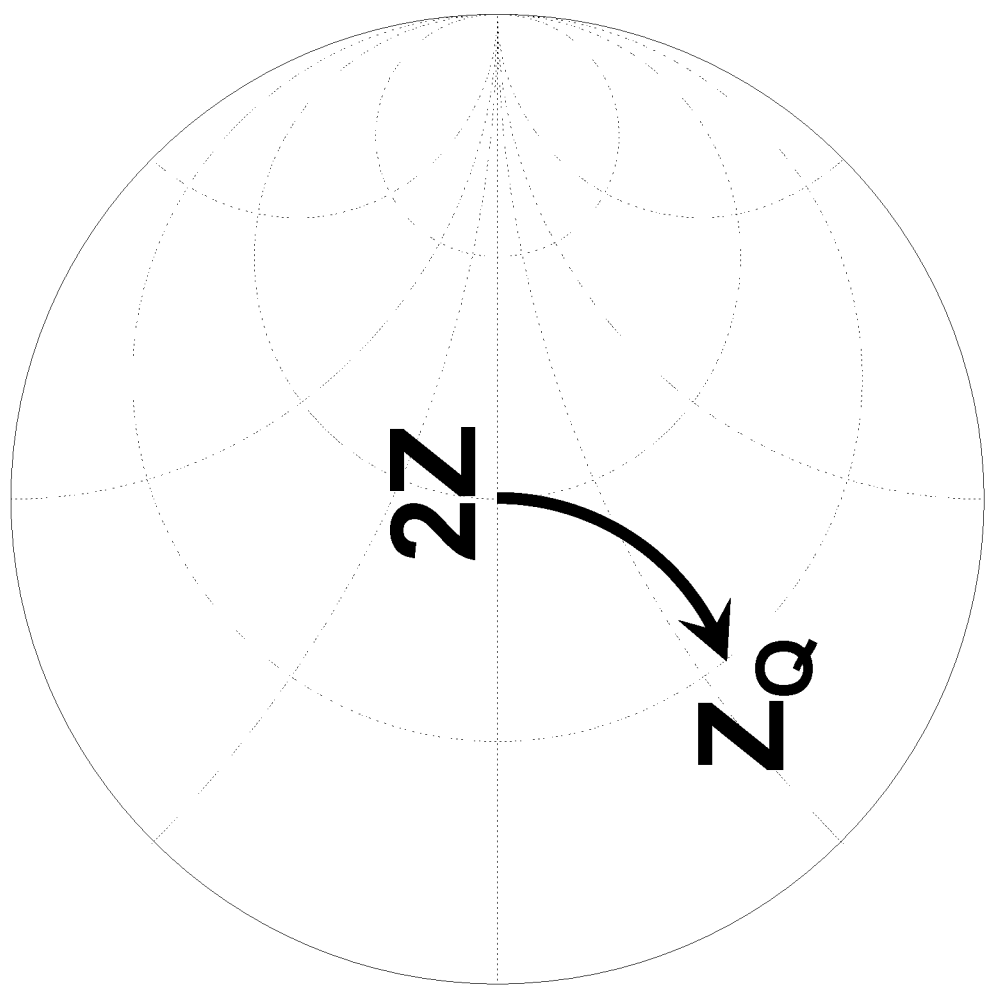
FIG. 4 is a diagram illustrating the locus of impedance of the combining circuit in the comparative example in the balanced mode.

FIG. 4 is a diagram illustrating the locus of impedance of the combining circuit in the comparative example in the balanced mode. In FIG. 4, the locus of impedance when moving from the center ($2Z_L$) through the transmission line Lx or the transmission line Ly is plotted on a Smith chart. In the comparative example, only one passive element (here, the transmission line Lx or the transmission line Ly) performs phase transformation and impedance transformation. Accordingly, the impedance $Z_Q$ on the combining circuit side as seen from the output of the transistors moves away from the real axis and becomes an imaginary number (see FIG. 4). Typically, the performance of a transistor is maximized when the impedance $Z_Q$ on the combining circuit side as seen from the output of the transistor is approximately a real number. In this respect, in the configuration in the comparative example 10, a substantially maximum imaginary part of the impedance $Z_Q$ occurs, which imposes a limitation on improvements of the linearity of the transistors.

Figure 5:
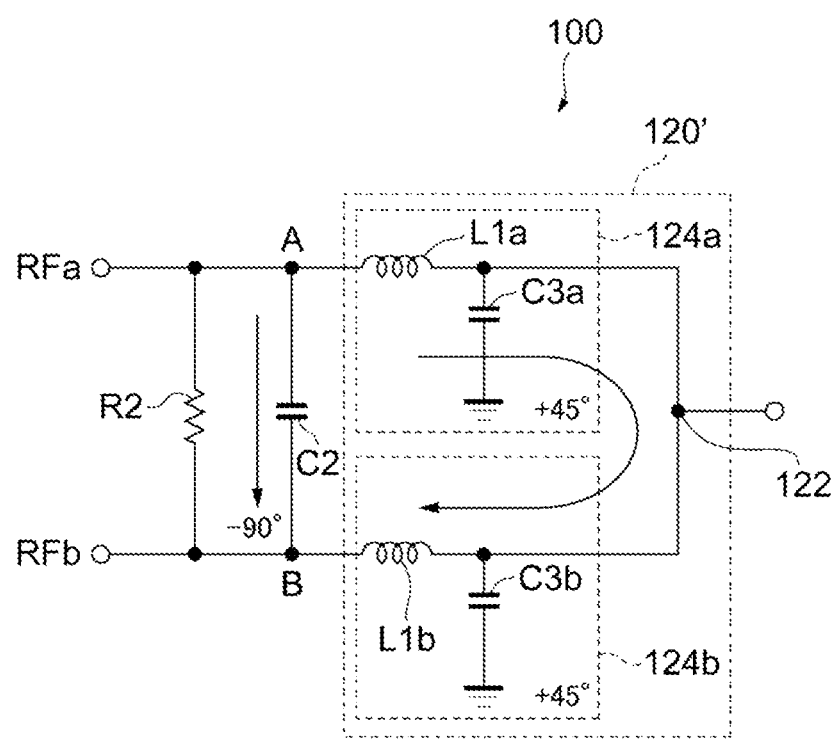
FIG. 5 is an equivalent circuit diagram of a combining circuit of the power amplifier module according to the first embodiment of the present disclosure in the unbalanced mode.

FIG. 5 is an equivalent circuit diagram of a combining circuit of the power amplifier module according to the first embodiment of the present disclosure in the unbalanced mode. The combining circuit 120 can be equivalently represented as a configuration (a combining circuit 120') including a phase shifter 124a (first phase shifter) constituted by the inductor L1a connected in series with the signal path and a capacitor C3a shunt-connected to the signal path, and a phase shifter 124b (second phase shifter) constituted by the inductor L1b connected in series with the signal path and a capacitor C3b shunt-connected to the signal path (see FIG. 5). That is, each of the phase shifters 124a and 124b has a configuration similar to that of an L-type low pass filter (LPF). In addition, as described below, the constants of the respective elements in the phase shifters 124a and 124b are designed such that the phase of an output signal is delayed by about 45 degrees with respect to the phase of an input signal. In contrast, as in the comparative example 10 illustrated in FIG. 2, the phase of the signal from the node A to the node B through the capacitor C2 is advanced by about 90 degrees with respect to the phase of the amplified signal RFa at the node A. Therefore, the phase of the signal from the node A to the node B through the phase shifter 124a, the combiner 122, and the phase shifter 124b is approximately opposite to the phase of the signal from the node A to the node B through the capacitor C2. That is, even if an amplified signal in one amplification path enters the other amplification path, the signal has amplitudes that cancel each other out, and isolation is ensured between the amplifiers.

Figure 6:
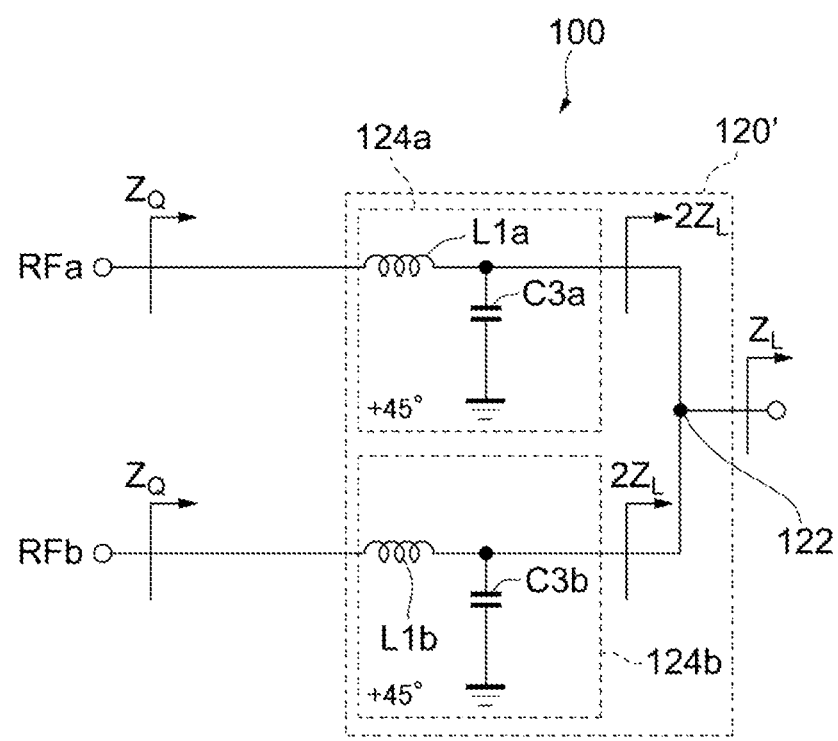
FIG. 6 is an equivalent circuit diagram of the combining circuit of the power amplifier module according to the first embodiment of the present disclosure in the balanced mode.

FIG. 6 is an equivalent circuit diagram of the combining circuit of the power amplifier module according to the first embodiment of the present disclosure in the balanced mode. In the balanced mode, as in FIG. 3, the resistance element R2 and the capacitor C2 are not illustrated.

The phase shifter 124a delays the phase of the signal by about 45 degrees and performs impedance transformation between the impedance $2Z_L$ on the load side as seen from the output of the phase shifter 124a and the impedance $Z_Q$ on the load side as seen from the output of the transistor Q1a (not illustrated). Likewise, the phase shifter 124b delays the phase of the signal by about 45 degrees and performs impedance transformation between the impedance $2Z_L$ on the load side as seen from the output of the phase shifter 124b and the impedance $Z_Q$ on the load side as seen from the output of the transistor Q1b (not illustrated).

Figure 7:
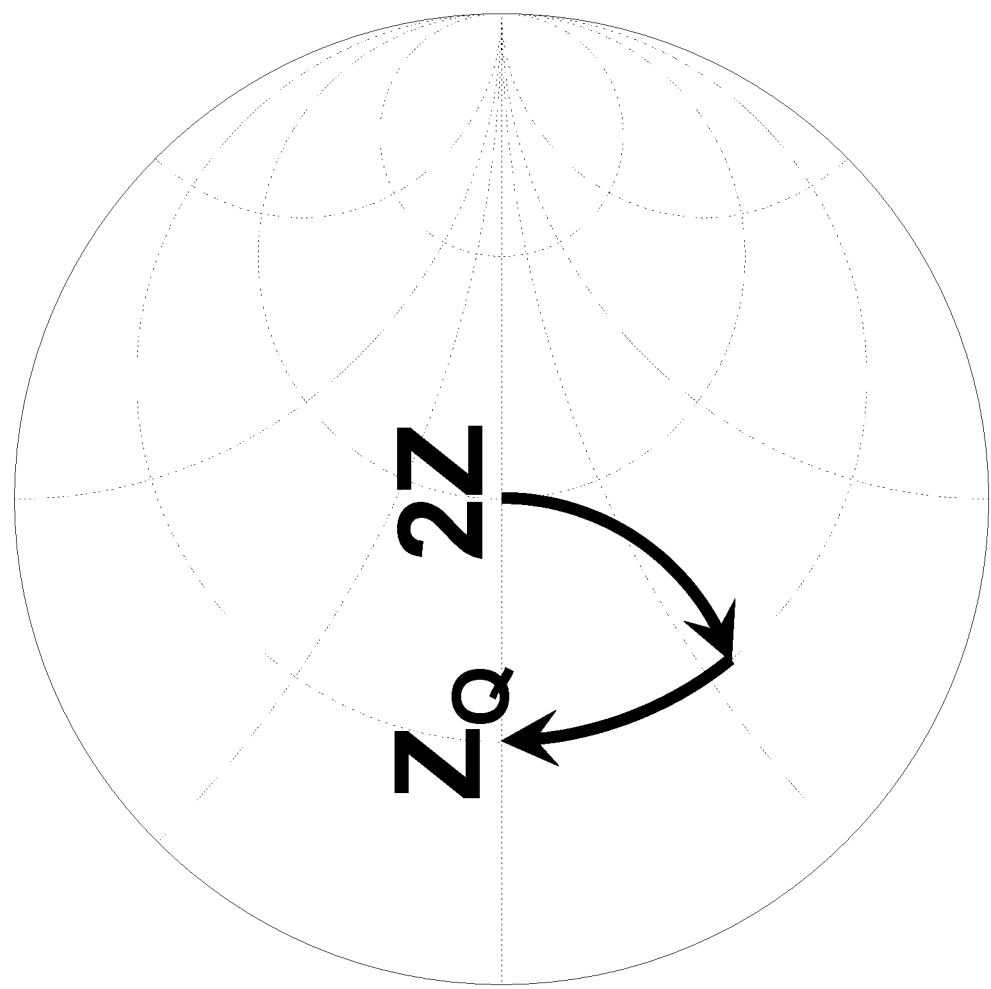
FIG. 7 is a diagram illustrating the locus of impedance of the combining circuit of the power amplifier module according to the first embodiment of the present disclosure in the balanced mode.

FIG. 7 is a diagram illustrating the locus of impedance of the combining circuit of the power amplifier module according to the first embodiment of the present disclosure in the balanced mode. In FIG. 7, the locus of impedance when moving from the center ($2Z_L$) through the phase shifter 124a or the phase shifter 124b is plotted on a Smith chart. In the power amplifier module 100, two passive elements (the inductor L1a and the capacitor C3a or the inductor L1b and the capacitor C3b) perform phase transformation and impedance transformation. In the power amplifier module 100, therefore, the impedance $Z_Q$ on the combining circuit side as seen from the output of the transistors can be made close to the real axis (see FIG. 7).

Figure 8:
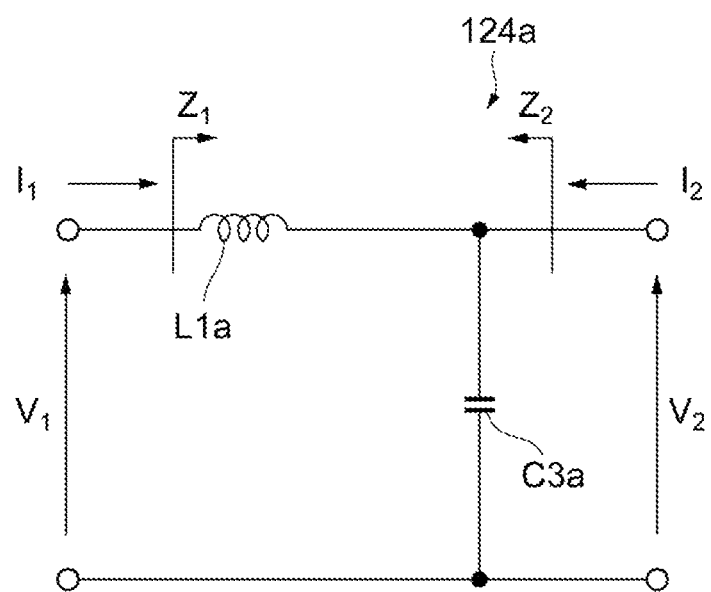
FIG. 8 is a diagram used to describe impedance transformation in a phase shifter.

FIG. 8 is a diagram used to describe impedance transformation in the phase shifter 124a. As illustrated in FIG. 6, the phase shifter 124a includes the inductor L1a connected in series with the signal path, and the capacitor C3a shunt-connected to the signal path. In addition, an input voltage is represented by $V_1$, an output voltage is represented by $V_2$, an input current is represented by $I_1$, an output current is represented by $I_2$, the impedance on the phase shifter side as seen from the input terminal is represented by $Z_1$, the impedance on the phase shifter side as seen from the output terminal is represented by $Z_2$, the inductance of the inductor L1a is represented by L, the capacitance of the capacitor C3a is represented by C, and the angular frequency of a signal relative to the center frequency is represented by w.

The fundamental matrix of the phase shifter 124a is represented by equation (1) below.

$$\begin{pmatrix} V_1 \\ I_1 \end{pmatrix} = \begin{pmatrix} 1-\omega^2 LC & j\omega L \\ j\omega C & 1 \end{pmatrix} \begin{pmatrix} V_2 \\ -I_2 \end{pmatrix} \quad (1)$$

Accordingly, a gain characteristic of the phase shifter 124a satisfies equation (2) below.

$$\frac{V_2}{V_1} = \left((1-\omega^2 LC) - \frac{1}{Z_2}j\omega L\right)^{-1} = \frac{(1-\omega^2 LC) + j\frac{\omega L}{Z_2}}{(1-\omega^2 LC)^2 + \left(-\frac{\omega L}{Z_2}\right)^2} \quad (2)$$

Furthermore, a gain characteristic of the phase shifter 124a satisfies equation (3) below.

$$\frac{V_2}{V_1} = \left(Z_1\left(j\omega C - \frac{1}{Z_2}\right)\right)^{-1} = \frac{1}{Z_1} \frac{-\frac{1}{Z_2} - j\omega C}{\left(-\frac{1}{Z_2}\right)^2 + (\omega C)^2} \quad (3)$$

If the phase shifter 124a has a phase difference of π/4, equation (4) below holds from equation (2) above.

$$\tan^{-1}\left(\frac{\frac{\omega L}{Z_2}}{(1-\omega^2 LC)}\right) = \frac{\pi}{4} \quad (4)$$

Likewise, equation (5) below holds from equation (3) above.

$$\tan^{-1}\left(\frac{\omega C}{\frac{1}{Z_2}}\right) = \frac{\pi}{4} \quad (5)$$

In addition, equation (6) below holds from equations (4) and (5) above.

$$\frac{\omega L}{Z_2(1-\omega^2 LC)} = \omega C Z_2 = \tan\left(\frac{\pi}{4}\right) \quad (6)$$

Accordingly, if the phase shifter 124a has a phase difference of π/4, the inductance of the inductor L1a is given by $L=Z_2/2\omega$ and the capacitance of the capacitor C3a is given by $C=1/\omega Z_2$. At this time, as given in equation (7) below, the impedance $Z_1$ (i.e., the impedance corresponding to the impedance $Z_Q$ illustrated in FIG. 6) becomes a real number.

$$Z_1 = \frac{(1-\omega^2 LC)Z_2 + j\omega L}{j\omega C Z_2 + 1} = \frac{Z_2}{2} \quad (7)$$

As described above, the power amplifier module 100 may be designed such that the impedance $Z_Q$ becomes a real number while ensuring isolation between the amplifiers in the unbalanced mode. That is, the power amplifier module 100 allows the transistors to operate at higher performance than the transistors in the comparative example 10, and can improve the linearity of the transistors.

While the power amplifier module 100 has a configuration in which the resistance element R2 and the capacitor C2 are disposed close to the combining circuit 120, the resistance element R2 and the capacitor C2 may be disposed close to the divider circuit 110. The order in which the resistance element R2 and the capacitor C2 are arranged is not limited to that illustrated in the drawings, and the resistance element R2 may be arranged closer to the combining circuit 120 than the capacitor C2.

While FIG. 1 illustrates a configuration including single-stage amplifiers, the number of stages of amplifiers is not limited to one. Two or more stages of amplifiers may be used. In a power amplifier module including two or more stages of amplifiers, amplifiers in the final stage (power stage) exhibit maximum output power compared with amplifiers in the other stages. Thus, it is desirable that the amplifiers in the final stage have the illustrated configuration.

In the power amplifier module 100, two amplification paths are used, by way of example but not limitation. The number of amplification paths is not limited to this, and three or more amplification paths may be used.

Figure 9:
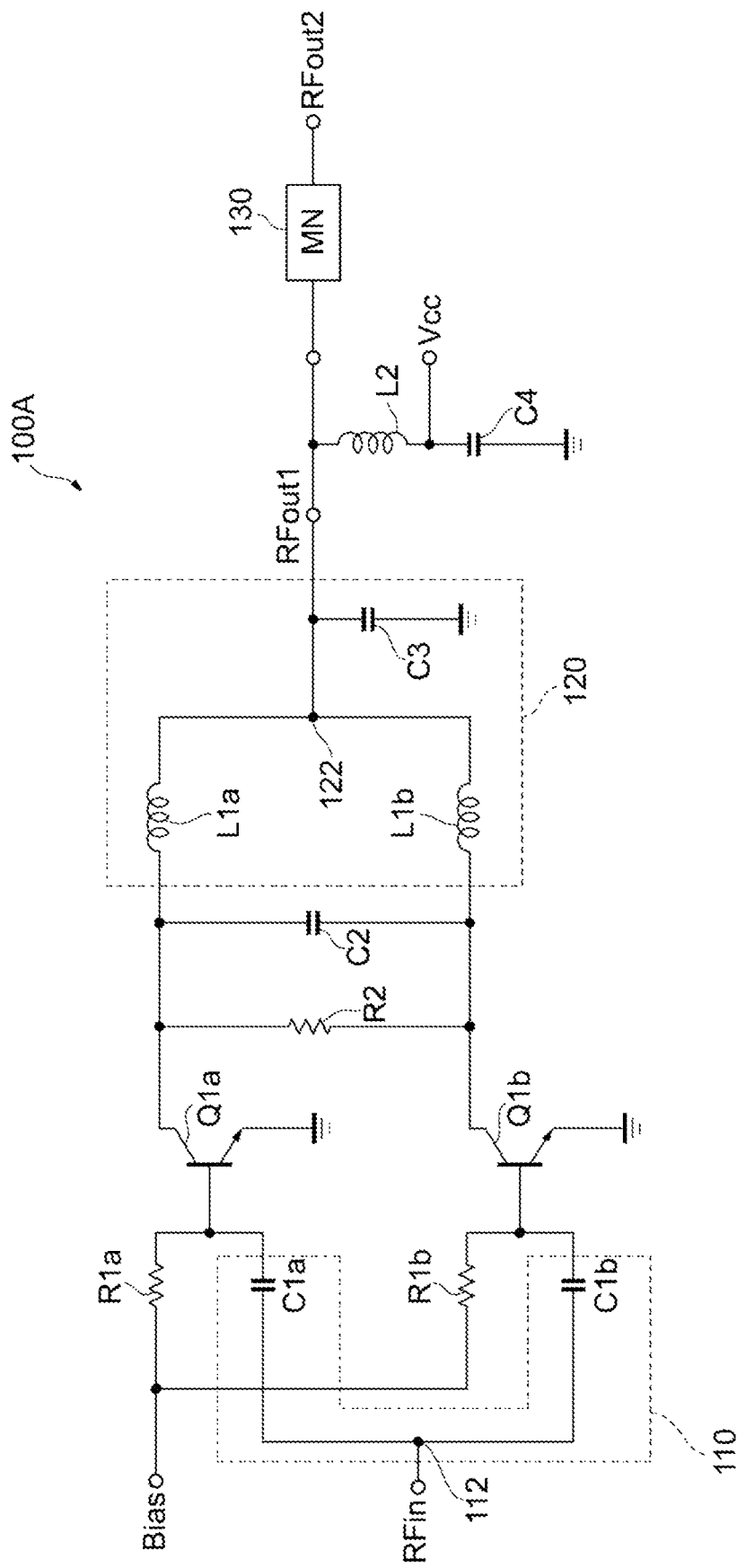
FIG. 9 is a diagram illustrating another example configuration of the power amplifier module according to the first embodiment of the present disclosure.

FIG. 9 is a diagram illustrating another example configuration of the power amplifier module according to the first embodiment of the present disclosure. The same or substantially the same components as those in the power amplifier module 100 illustrated in FIG. 1 are assigned the same numerals and are not described herein. Features common to the first embodiment and this and subsequent embodiments are not described and only the differences from the first embodiment will be described. In particular, similar effects achieved using similar configurations will not be repeatedly described in the individual embodiments. A power amplifier module 100A further includes an inductor L2, a capacitor C4, and an output matching network (MN) 130 in addition to the configuration of the power amplifier module 100.

The inductor L2 and the capacitor C4 form a bias circuit that supplies voltage or current to the collectors of the transistor Q1a and the transistor Q1b. Specifically, the inductor L2 has an end to which a power supply voltage Vcc is supplied and another end electrically connected to an output terminal of the combining circuit 120. The inductor L2 prevents or reduces a cross talk of the RF signal from the signal line to a power supply. The capacitor C4 has an end to which the power supply voltage Vcc is supplied and another end grounded. The capacitor C4 is a decoupling capacitor that stabilizes the power supply voltage Vcc.

The output matching network 130 has an end to which the amplified signal RFout1 is supplied and another end from which an output signal RFout2 is output. The output matching network 130 is a circuit that performs impedance matching between the combining circuit 120 in the preceding stage and a load (for example, 50Ω) in the subsequent stage. The output matching network 130 is constituted by, for example, a capacitor and an inductor.

With the configuration described above, the power amplifier module 100A can also achieve advantages similar to those of the power amplifier module 100. In the power amplifier module 100A, in addition, a single bias circuit can supply voltage or current to both the collector of the transistor Q1a and the collector of the transistor Q1b. Thus, this configuration can reduce the circuit scale compared with a configuration in which respective bias circuits are used to supply voltage or current to the collectors of the transistors.

Figure 10:
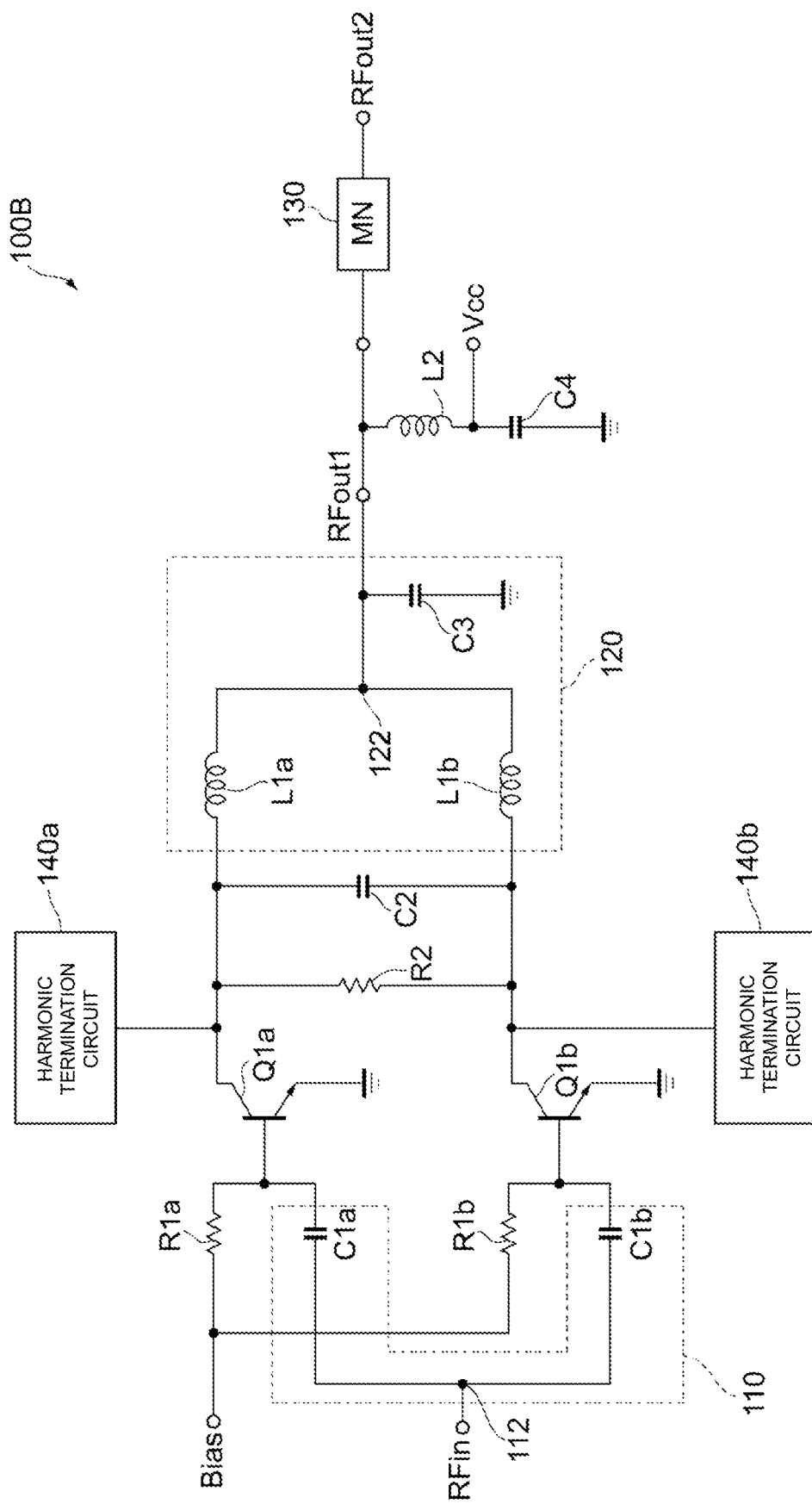
FIG. 10 is a diagram illustrating another example configuration of the power amplifier module according to the first embodiment of the present disclosure.

FIG. 10 is a diagram illustrating another example configuration of the power amplifier module according to the first embodiment of the present disclosure. The same or substantially the same components as those in the power amplifier module 100A illustrated in FIG. 9 are assigned the same numerals and are not described herein. A power amplifier module 100B further includes harmonic termination circuits 140a and 140b in addition to the configuration of the power amplifier module 100A.

The harmonic termination circuit 140a (first harmonic termination circuit) is connected to the collector (output terminal) of the transistor Q1a, and short-circuits a harmonic (such as the second or third harmonic) of the amplified signal output from the transistor Q1a. Likewise, the harmonic termination circuit 140b (second harmonic termination circuit) is connected to the collector (output terminal) of the transistor Q1b, and short-circuits a harmonic (such as the second or third harmonic) of the amplified signal output from the transistor Q1b. The configuration of the harmonic termination circuits 140a and 140b is not limited to any specific type. For example, each of the harmonic termination circuits 140a and 140b may be an LC series resonant circuit having a resonant frequency equal to a harmonic frequency of the corresponding amplified signal.

With the configuration described above, the power amplifier module 100B can also achieve advantages similar to those of the power amplifier module 100. In addition, since the harmonic termination circuits 140a and 140b attenuate harmonics, the power amplifier module 100B can exhibit improved power efficiency compared with the power amplifier modules 100 and 100A.

Figure 11:
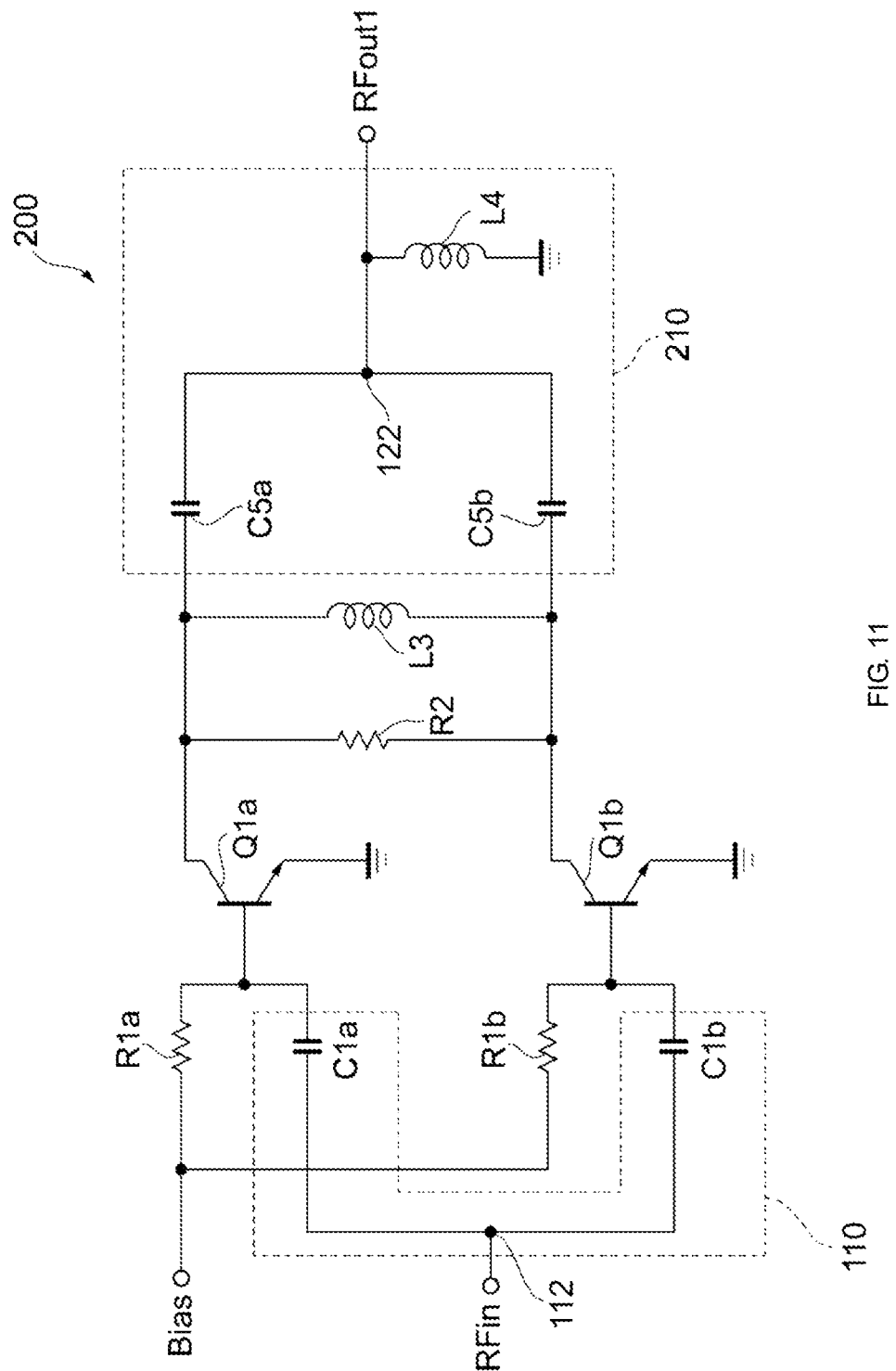
FIG. 11 is a diagram illustrating an example configuration of a power amplifier module according to a second embodiment of the present disclosure.

FIG. 11 is a diagram illustrating an example configuration of a power amplifier module according to a second embodiment of the present disclosure. The same or substantially the same components as those in the power amplifier module 100 illustrated in FIG. 1 are assigned the same numerals and are not described herein. Unlike the configuration of the power amplifier module 100, a power amplifier module 200 includes a combining circuit 210 instead of the combining circuit 120, and an inductor L3 instead of the capacitor C2.

The combining circuit 210 includes a capacitor C5a (third capacitor), a capacitor C5b (fourth capacitor), an inductor L4 (fourth inductor), and the combiner 122. The capacitor C5a is connected in series between the collector of the transistor Q1a and the combiner 122, and the capacitor C5b is connected in series between the collector of the transistor Q1b and the combiner 122. The inductor L4 has an end connected to the combiner 122 and another end grounded. The inductor L4 has an inductance that is approximately half the inductance of the inductor L3, for example.

The inductor L3 (third inductor) is connected in parallel to the resistance element R2. Specifically, the inductor L3 has an end connected to the collector of the transistor Q1a and another end connected to the collector of the transistor Q1b.

The power amplifier module 200 has a configuration such that some of the capacitors in the power amplifier module 100 are replaced by inductors and the inductors in the power amplifier module 100 are replaced by capacitors. That is, the combining circuit 210 in the power amplifier module 200 includes a phase shifter (third phase shifter) constituted by the capacitor C5a connected in series with the signal path and the inductor L4 shunt-connected to the signal path, and a phase shifter (fourth phase shifter) constituted by the capacitor C5b connected in series with the signal path and the inductor L4 shunt-connected to the signal path. Each of the phase shifters has a configuration similar to that of an L-type high pass filter (HPF), and the constants of the respective elements in the phase shifters are designed such that the phase of an output signal is advanced by about 45 degrees with respect to the phase of an input signal.

Also in the combining circuit 210, as in the combining circuit 120 illustrated in FIG. 1, in the unbalanced mode, the phase of the signal from the output terminal of the transistor Q1a to the output terminal of the transistor Q1b through the capacitor C5a, the inductor L4, and the capacitor C5b is advanced by about 90 degrees, and the phase of the signal from the output terminal of the transistor Q1a to the output terminal of the transistor Q1b through the inductor L3 is delayed by about 90 degrees. Thus, isolation is ensured between the amplifiers in the unbalanced mode. In the balanced mode, the impedance $Z_O$ on the load side as seen from the output of the amplifiers can become a real number. Therefore, the power amplifier module 200 can achieve advantages similar to those of the power amplifier module 100.

Figure 12:
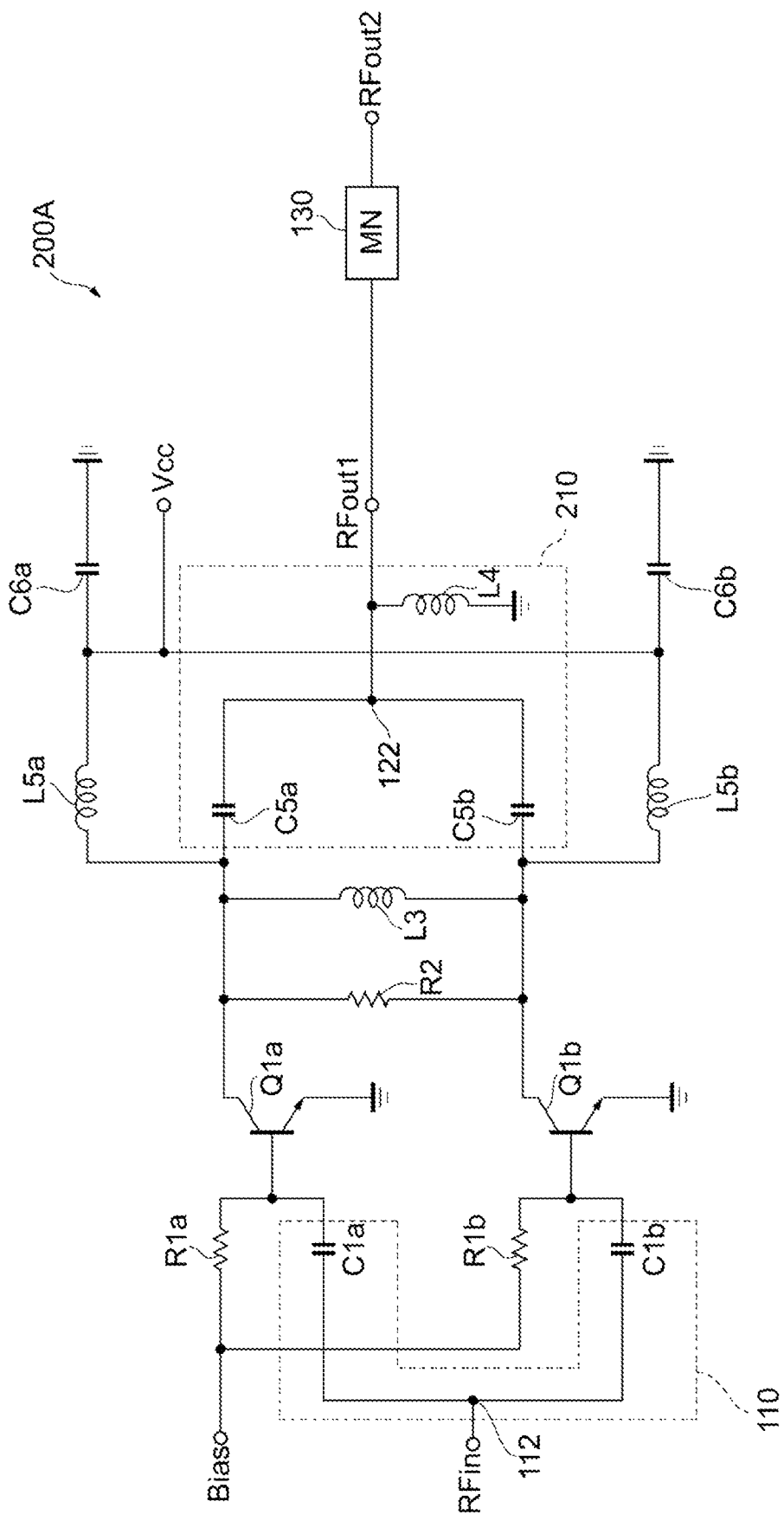
FIG. 12 is a diagram illustrating another example configuration of the power amplifier module according to the second embodiment of the present disclosure.

FIG. 12 is a diagram illustrating another example configuration of the power amplifier module according to the second embodiment of the present disclosure. The same or substantially the same components as those in the power amplifier module 200 illustrated in FIG. 11 are assigned the same numerals and are not described herein. A power amplifier module 200A further includes inductors L5a and L5b, capacitors C6a and C6b, and the output matching network 130 in addition to the configuration of the power amplifier module 200.

The inductor L5a and the capacitor C6a form a bias circuit that supplies voltage or current to the collector of the transistor Q1a, and the inductor L5b and the capacitor C6b form a bias circuit that supplies voltage or current to the transistor Q1b. Specifically, the inductor L5a has an end to which a power supply voltage Vcc is supplied and another end electrically connected to a node of the collector of the transistor Q1a and the capacitor C5a. The inductor L5b has an end to which the power supply voltage Vcc is supplied and another end electrically connected to a node of the collector of the transistor Q1b and the capacitor C5b. Each of the capacitors C6a and C6b has an end to which the power supply voltage Vcc is supplied and another end grounded. The functions of the inductors L5a and L5b and the capacitors C6a and C6b are similar to those of the inductor L2 and the capacitor C4 in the power amplifier module 100A and are not described in detail herein.

The output matching network 130 has an end to which the amplified signal RFout1 is supplied and another end from which an output signal RFout2 is output.

With the configuration described above, the power amplifier module 200A can also achieve advantages similar to those of the power amplifier module 100. In the power amplifier module 200A, in addition, bias circuits that supply voltage or current to the collectors are connected in parallel. With this configuration, the parasitic resistance of the inductors L5a and L5b and the capacitors C6a and C6b is approximately half that in a configuration in which bias circuits that supply voltage or current to the collectors are not connected in parallel. As a result, an improvement in performance such as linearity of an output signal can be achieved.

Like the power amplifier module 100B illustrated in FIG. 10, the power amplifier modules 200 and 200A may include the harmonic termination circuits 140a and 140b.

Figure 13:
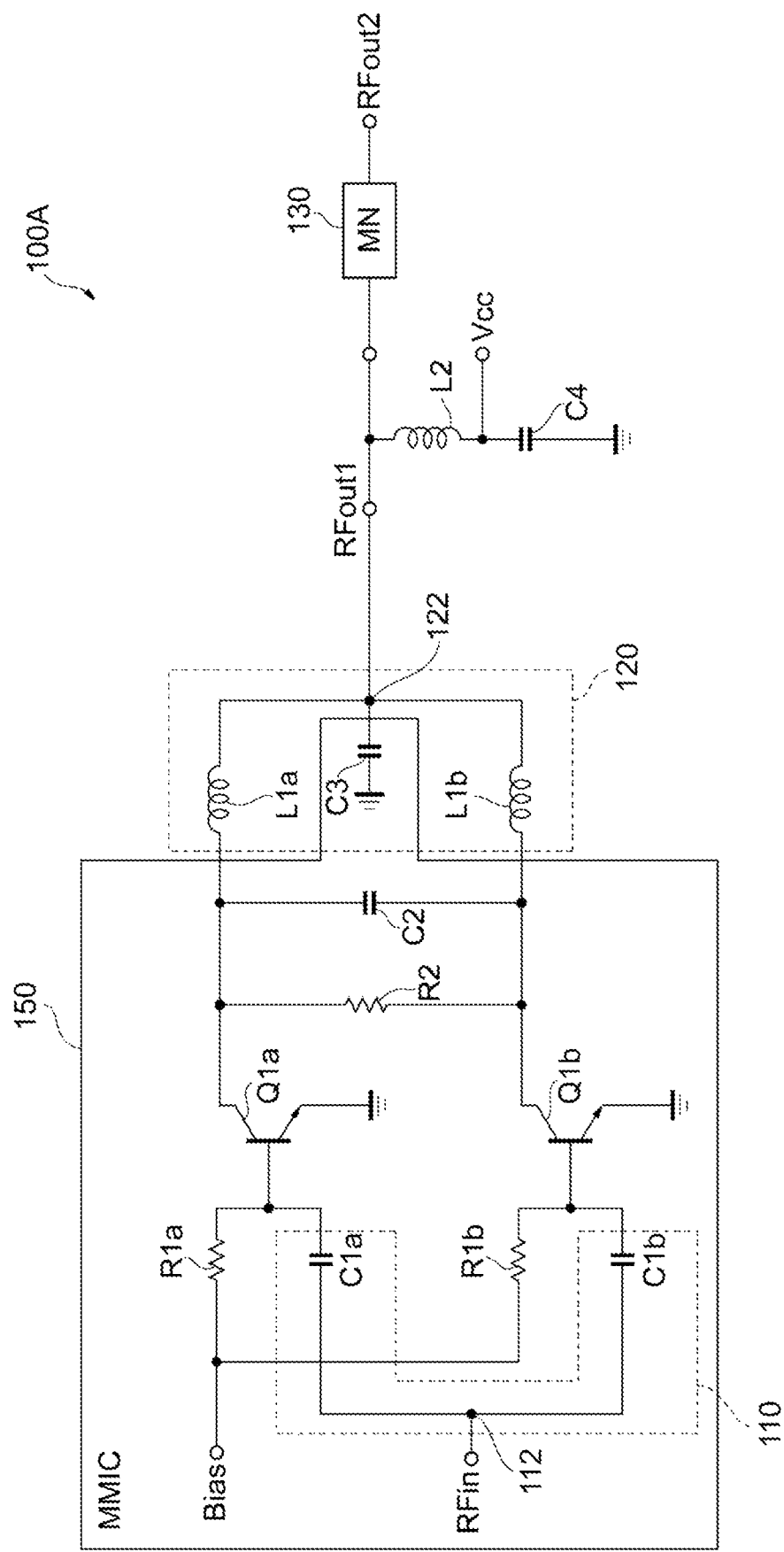
FIG. 13 is a diagram illustrating an example of the mounting of the power amplifier module according to the first embodiment of the present disclosure.

FIG. 13 is a diagram illustrating an example of the mounting of the power amplifier module according to the first embodiment of the present disclosure. The constituent elements of the power amplifier module are similar to those of the power amplifier module 100A illustrated in FIG. 9 and are not described herein.

As illustrated in FIG. 13, in the power amplifier module 100A, the divider circuit 110, the transistors Q1a and Q1b, the resistance elements R1a, R1b, and R2, and the capacitors C2 and C3 are integrated on the same substrate, namely, on a substrate 150. The substrate 150 may be, for example, a monolithic microwave integrated circuit (MMIC). This configuration can reduce the circuit scale. The inductors L1a and L1b may be mounted on a module in which the power amplifier module 100A is formed, by using surface mount device (SMD), wiring, or any other technique.

On the substrate 150, the resistance element R2 and the capacitors C2 and C3 may be mounted between the transistor Q1a and the transistor Q1b. On the substrate 150, furthermore, when the principal surface of the substrate 150 is viewed in plan, a set of paired elements (such as the transistor Q1a and the transistor Q1b or the capacitor C1a and the capacitor C1b) may be arranged substantially symmetrically with respect to a line in such a manner as to be centered around a set of unpaired elements (such as the resistance element R2 and the capacitors C2 and C3). A set of paired elements are arranged substantially symmetrically with respect to a line, which can prevent or reduce imbalance in signal between the two amplification paths.

In a power amplifier module including the harmonic termination circuits 140a and 140b illustrated in FIG. 10, the harmonic termination circuits 140a and 140b may also be mounted substantially symmetrically with respect to a line on the substrate 150. This also applies to an example of the mounting of the power amplifier module according to the second embodiment described below.

Figure 14:
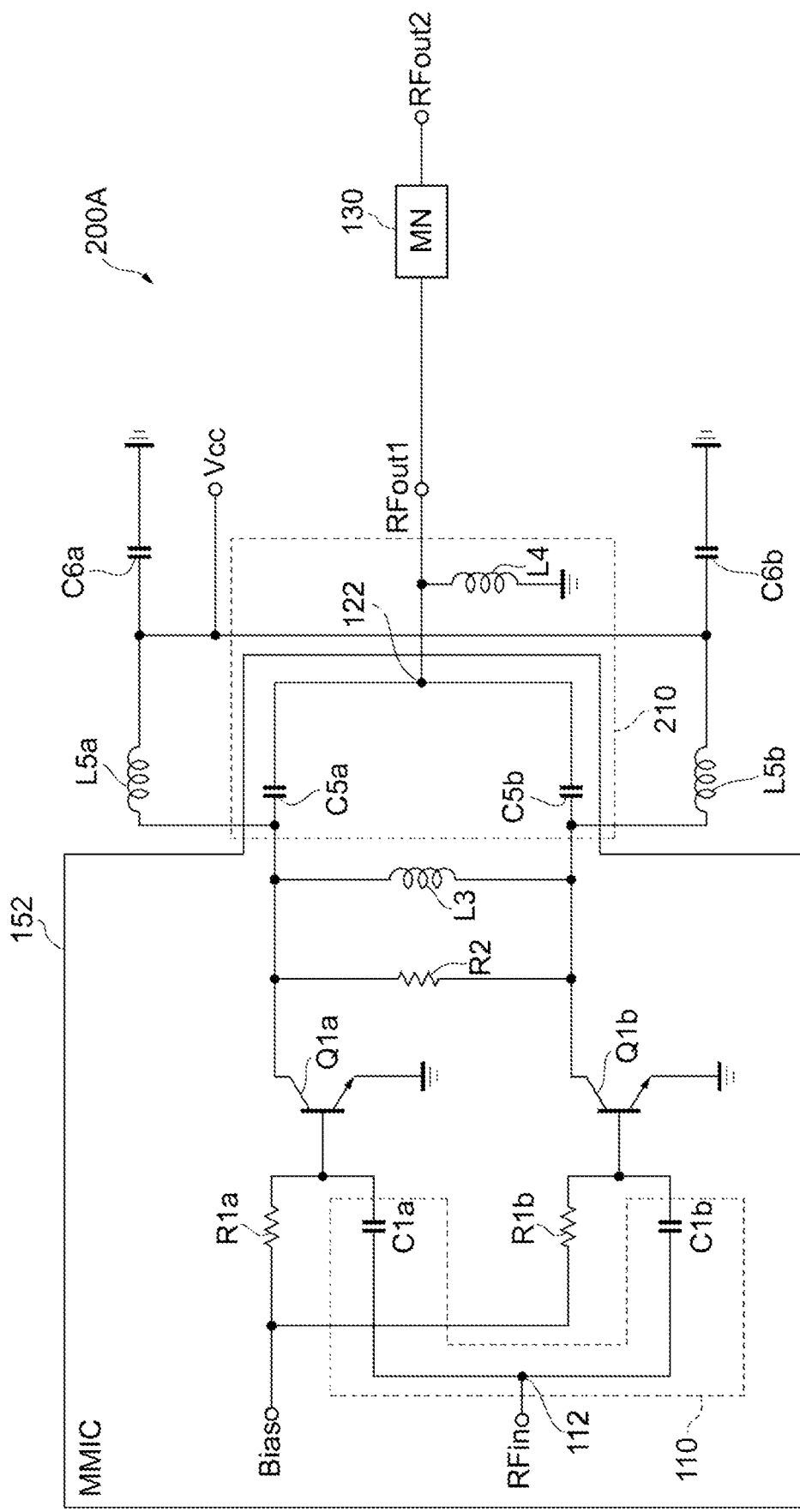
FIG. 14 is a diagram illustrating an example of the mounting of the power amplifier module according to the second embodiment of the present disclosure.

FIG. 14 is a diagram illustrating an example of the mounting of the power amplifier module according to the second embodiment of the present disclosure. The constituent elements of the power amplifier module are similar to those of the power amplifier module 200A illustrated in FIG. 12 and are not described herein.

As illustrated in FIG. 14, in the power amplifier module 200A, the divider circuit 110, the transistors Q1a and Q1b, the resistance elements R1a, R1b, and R2, the inductor L3, and the capacitors C5a and C5b are integrated on the same substrate, namely, on a substrate 152. The substrate 152 may be an MMIC, for example. This configuration can reduce the circuit scale. The inductor L4 may be mounted on a module in which the power amplifier module 200A is formed, by using SMD, wiring, or any other technique.

On the substrate 152, the resistance element R2 and the inductor L3 may be mounted between the transistor Q1a and the transistor Q1b. On the substrate 152, furthermore, when the principal surface of the substrate 152 is viewed in plan, a set of paired elements (such as the transistor Q1a and the transistor Q1b or the capacitor C1a and the capacitor C1b) may be arranged substantially symmetrically with respect to a line in such a manner as to be centered around a set of unpaired elements (such as the resistance element R2 and the inductor L3).

Exemplary embodiments of the present disclosure have been described. The power amplifier modules 100, 100A, and 100B include the capacitor C2 that electrically connects the collectors of the transistors Q1a and Q1b to each other, and the combining circuit 120 includes the inductors L1a and L1b, which are connected in series with a signal path, and the capacitor C3, which is shunt-connected to the signal path. With this configuration, the phase of an amplified signal output from the collector of the transistor Q1a is delayed by about 45 degrees by passing through the phase shifter 124a including the inductor L1a and the capacitor C3, and is delayed by about 45 degrees by passing through the phase shifter 124b including the inductor L1b and the capacitor C3. Further, the phase of the amplified signal output from the collector of the transistor Q1a is advanced by about 90 degrees by passing through the capacitor C2. Accordingly, even if an amplified signal in one amplification path enters the other amplification path, the signal has amplitudes that cancel each other out, and isolation is ensured between the amplifiers. In addition, the configuration can be designed such that the impedance $Z_Q$ on the combining circuit side as seen from the transistors Q1a and Q1b becomes a real number, which can improve the linearity of the transistors compared with the comparative example.

In the power amplifier modules 100, 100A, and 100B, furthermore, the capacitor C3 may have a capacitance that is about twice the capacitance of the capacitor C2.

In the power amplifier modules 100, 100A, and 100B, furthermore, the divider circuit 110, the transistors Q1a and Q1b, the resistance element R2, and the capacitors C2 and C3 may be formed on the same substrate. This configuration can reduce the circuit scale.

Further, the power amplifier modules 200 and 200A include the inductor L3 that electrically connects the collectors of the transistors Q1a and Q1b to each other, and the combining circuit 210 includes the capacitors C5a and C5b, which are connected in series with a signal path, and the inductor L4, which is shunt-connected to the signal path. With this configuration, the phase of an amplified signal output from the collector of the transistor Q1a is advanced by about 45 degrees by passing through a phase shifter including the capacitor C5a and the inductor L4, and is advanced by about 45 degrees by passing through a phase shifter including the capacitor C5b and the inductor L4. In addition, the phase of the amplified signal output from the collector of the transistor Q1a is delayed by about 90 degrees by passing through the inductor L3. Accordingly, even if an amplified signal in one amplification path enters the other amplification path, the signal has amplitudes that cancel each other out, and isolation is ensured between the amplifiers. In addition, the configuration can be designed such that the impedance $Z_Q$ on the combining circuit side as seen from the transistors Q1a and Q1b becomes a real number, which can improve the linearity of the transistors compared with the comparative example.

In the power amplifier modules 200 and 200A, furthermore, the inductor L4 may have an inductance that is approximately half the inductance of the inductor L3.

In the power amplifier module 200, furthermore, the divider circuit 110, the transistors Q1a and Q1b, the resistance element R2, the inductor L3, and the capacitors C5a and C5b may be formed on the same substrate. This configuration can reduce the circuit scale.

Further, the power amplifier module 100B includes the harmonic termination circuits 140a and 140b connected to the collectors of the transistors Q1a and Q1b, respectively. This configuration attenuates harmonics from the amplified signals obtained by the transistors Q1a and Q1b. Thus, the power amplifier module 100B can exhibit improved power efficiency compared with the power amplifier modules 100 and 100A.

The embodiments described above are intended to help easily understand the present disclosure, and are not to be used to construe the present disclosure in a limiting fashion. Various modifications or improvements can be made to the present disclosure without departing from the gist of the present disclosure, and equivalents thereof are also included in the present disclosure. That is, the embodiments may be appropriately modified in design by those skilled in the art, and such modifications also fall within the scope of the present disclosure so long as the modifications include the features of the present disclosure. For example, the elements included in the embodiments described above and the arrangement, materials, conditions, shapes, sizes, and the like thereof are not limited to those described in the illustrated examples but can be modified as appropriate. Furthermore, the embodiments are illustrative. It is to be understood that elements included in different embodiments can be partially replaced or combined with each other and such replacements or combinations of elements also fall within the scope of the present disclosure so long as the replacements or combinations of elements include the features of the present disclosure.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A power amplifier module comprising:
    a divider circuit that divides an input signal into a first signal and a second signal;
    a first amplifier that amplifies the first signal and outputs a third signal;
    a second amplifier that amplifies the second signal and outputs a fourth signal;
    a combining circuit that combines the third signal and the fourth signal and that outputs an amplified signal of the input signal;
    a resistance element that electrically connects an output terminal of the first amplifier and an output terminal of the second amplifier to each other; and
    a first inductor connected in parallel to the resistance element,
    wherein the combining circuit comprises:
        a combiner,
        a first capacitor connected in series between the output terminal of the first amplifier and the combiner,
        a second capacitor connected in series between the output terminal of the second amplifier and the combiner, and
        a second inductor having a first end connected to the combiner and a second end grounded, the first capacitor and the second inductor together forming a first phase shifter and the second capacitor and the second inductor together forming a second phase shifter,
        wherein a phase of the third signal from the output terminal of the first amplifier to the output terminal of the second amplifier through the combiner is advanced by about 45 degrees in the first phase shifter, and is advanced by about 45 degrees in the second phase shifter,
        wherein a phase of the third signal from the output terminal of the first amplifier to the output terminal of the second amplifier through the first inductor is delayed by about 90 degrees, and
        wherein an inductance value of the second inductor is about half an inductance value of the first inductor.

2. The power amplifier module according to claim 1, wherein the divider circuit, the first amplifier, the second amplifier, the resistance element, the first capacitor, and the second capacitor are formed on a single substrate.

3. The power amplifier module according to claim 2, further comprising:
    a first harmonic termination circuit connected to the output terminal of the first amplifier, the first harmonic termination circuit short-circuiting a harmonic of the third signal; and
    a second harmonic termination circuit connected to the output terminal of the second amplifier, the second harmonic termination circuit short-circuiting a harmonic of the fourth signal.

4. The power amplifier module according to claim 1, wherein the divider circuit, the first amplifier, the second amplifier, the resistance element, the first inductor, the first capacitor, and the second capacitor are formed on a single substrate.

5. The power amplifier module according to claim 1, further comprising:
    a first harmonic termination circuit connected to the output terminal of the first amplifier, the first harmonic termination circuit short-circuiting a harmonic of the third signal; and
    a second harmonic termination circuit connected to the output terminal of the second amplifier, the second harmonic termination circuit short-circuiting a harmonic of the fourth signal.

6. A power amplifier module comprising:
    a divider circuit that divides an input signal into a first signal and a second signal;
    a first amplifier that amplifies the first signal and outputs a third signal;
    a second amplifier that amplifies the second signal and outputs a fourth signal;
    a combining circuit that combines the third signal and the fourth signal and that outputs an amplified signal of the input signal;
    a resistance element that electrically connects an output terminal of the first amplifier and an output terminal of the second amplifier to each other; and
    a first inductor connected in parallel to the resistance element, wherein
    the combining circuit comprises:
        a combiner,
    a first capacitor connected in series between the output terminal of the first amplifier and the combiner,
        a second capacitor connected in series between the output terminal of the second amplifier and the combiner, and
        a second inductor having a first end connected to the combiner and a second end grounded, the first capacitor and the second inductor together forming a first phase shifter and the second capacitor and the second inductor together forming a second phase shifter,
    wherein a phase of the third signal from the output terminal of the first amplifier to the output terminal of the second amplifier through the combiner is delayed by about 45 degrees in the first phase shifter, and is delayed by about 45 degrees in the second phase shifter, and
    wherein a phase of the third signal from the output terminal of the first amplifier to the output terminal of the second amplifier through the first capacitor is advanced by about 90 degrees, and
    wherein the divider circuit, the first amplifier, the second amplifier, the resistance element, the first inductor, and the second capacitor are formed on a single substrate.

7. The power amplifier module according to claim 1, wherein the first capacitor is formed on the single substrate with the divider circuit, the first amplifier, the second amplifier, the resistance element, the first inductor, and the second capacitor.

8. The power amplifier module according to claim 7, further comprising:
   a first harmonic termination circuit connected to the output terminal of the first amplifier, the first harmonic termination circuit short-circuiting a harmonic of the third signal; and
   a second harmonic termination circuit connected to the output terminal of the second amplifier, the second harmonic termination circuit short-circuiting a harmonic of the fourth signal.

9. The power amplifier module according to claim 7, wherein an inductance value of the second inductor is about half an inductance value of the first inductor.

10. The power amplifier module according to claim 6, wherein an inductance value of the second inductor is about half an inductance value of the first inductor.

11. The power amplifier module according to claim 6, further comprising:
   a first harmonic termination circuit connected to the output terminal of the first amplifier, the first harmonic termination circuit short-circuiting a harmonic of the third signal; and
   a second harmonic termination circuit connected to the output terminal of the second amplifier, the second harmonic termination circuit short-circuiting a harmonic of the fourth signal.

12. A power amplifier module comprising:
   a divider circuit that divides an input signal into a first signal and a second signal;
   a first amplifier that amplifies the first signal and outputs a third signal;
   a second amplifier that amplifies the second signal and outputs a fourth signal;
   a combining circuit that combines the third signal and the fourth signal and that outputs an amplified signal of the input signal;
   a resistance element that electrically connects an output terminal of the first amplifier and an output terminal of the second amplifier to each other;
   a first inductor connected in parallel to the resistance element;
   a first harmonic termination circuit connected to the output terminal of the first amplifier, the first harmonic termination circuit short-circuiting a harmonic of the third signal; and
   a second harmonic termination circuit connected to the output terminal of the second amplifier, the second harmonic termination circuit short-circuiting a harmonic of the fourth signal, wherein
   the combining circuit comprises:
      a combiner,
      a first capacitor connected in series between the output terminal of the first amplifier and the combiner,
         a second capacitor connected in series between the output terminal of the second amplifier and the combiner, and
         a second inductor having a first end connected to the combiner and a second end grounded, the first capacitor and the second inductor together forming a first phase shifter and the second capacitor and the second inductor together forming a second phase shifter,
      wherein a phase of the third signal from the output terminal of the first amplifier to the output terminal of the second amplifier through the combiner is delayed by about 45 degrees in the first phase shifter, and is delayed by about 45 degrees in the second phase shifter, and
      wherein a phase of the third signal from the output terminal of the first amplifier to the output terminal of the second amplifier through the first capacitor is advanced by about 90 degrees.

13. The power amplifier module according to claim 12, wherein an inductance value of the second inductor is about half an inductance value of the first inductor.

14. The power amplifier module according to claim 12, wherein the divider circuit, the first amplifier, the second amplifier, the resistance element, the first capacitor, and the second capacitor are formed on a single substrate.

15. The power amplifier module according to claim 14, wherein an inductance value of the second inductor is about half an inductance value of the first inductor.

16. The power amplifier module according to claim 12, wherein the divider circuit, the first amplifier, the second amplifier, the resistance element, the first inductor, the first capacitor, and the second capacitor are formed on a single substrate.

17. The power amplifier module according to claim 16, wherein an inductance value of the second inductor is about half an inductance value of the first inductor.

18. The power amplifier module according to claim 14, wherein the first harmonic termination circuit and the second harmonic termination circuit are arranged substantially symmetrically with respect to a line on the single substrate.

19. The power amplifier module according to claim 16, wherein the first harmonic termination circuit and the second harmonic termination circuit are arranged substantially symmetrically with respect to a line on the single substrate.

* * * * *

UNITED STATES PATENT AND TRADEMARK OFFICE
CERTIFICATE OF CORRECTION

PATENT NO. : 10,756,681 B2
APPLICATION NO. : 16/513880
DATED : August 25, 2020
INVENTOR(S) : Masatoshi Hase Page 1 of 1

It is certified that error appears in the above-identified patent and that said Letters Patent is hereby corrected as shown below:

In the Specification

Column 4, Line 50, "X/8 lines, where X denotes" should be -- $\lambda$/8 lines, where $\lambda$ denotes --.

Signed and Sealed this
Sixth Day of April, 2021

Drew Hirshfeld
*Performing the Functions and Duties of the*
*Under Secretary of Commerce for Intellectual Property and*
*Director of the United States Patent and Trademark Office*